(12) United States Patent
Tang et al.

(10) Patent No.: US 10,756,292 B2
(45) Date of Patent: Aug. 25, 2020

(54) METHOD OF MANUFACTURING AN OLED PANEL AND AN OLED PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Jia Tang, Guangdong (CN); Jangsoon Im, Guangdong (CN); Xiaoxing Zhang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 15 days.

(21) Appl. No.: 15/742,517

(22) PCT Filed: Nov. 29, 2017

(86) PCT No.: PCT/CN2017/113673
§ 371 (c)(1),
(2) Date: Jan. 7, 2018

(87) PCT Pub. No.: WO2019/071759
PCT Pub. Date: Apr. 18, 2019

(65) Prior Publication Data
US 2019/0115561 A1    Apr. 18, 2019

(30) Foreign Application Priority Data
Oct. 13, 2017    (CN) .......................... 2017 1 0958776

(51) Int. Cl.
*H01L 51/52* (2006.01)
*H01L 27/32* (2006.01)
(Continued)

(52) U.S. Cl.
CPC ...... *H01L 51/5228* (2013.01); *H01L 27/3246* (2013.01); *H01L 27/3248* (2013.01);
(Continued)

(58) Field of Classification Search
CPC ......... H01L 51/52; H01L 27/32; H01L 51/00; H01L 51/56
See application file for complete search history.

(56) References Cited

U.S. PATENT DOCUMENTS

2008/0169545 A1* 7/2008 Kwon ................. H01L 21/6835
257/686
2013/0056784 A1* 3/2013 Lee ..................... H01L 27/3279
257/99
(Continued)

FOREIGN PATENT DOCUMENTS

| CN | 101055887 | 10/2007 |
| CN | 104934461 | 9/2015 |

*Primary Examiner* — Sheng-Bai Zhu
(74) *Attorney, Agent, or Firm* — Hemisphere Law, PLLC; Zhigang Ma

(57) ABSTRACT

A method of manufacturing an OLED panel and an OLED panel are provided. The method includes forming an anode connected to a source of a TFT, and a strap electrode connected to an auxiliary electrode on a TFT substrate. A sharp shaped corner is formed on the strap electrode, therefore an area of the electron transport layer and the electron injection layer corresponding to the sharp shaped corner have a thinner thickness. By applying a voltage between the auxiliary electrode and the cathode, the electron transport layer and the electron injection layer corresponding to the sharp shaped corner are punctured, the cathode is directly connected to the strap electrode and further conducted to the auxiliary electrode, resulting in a signal is inputted to the cathode through the auxiliary electrode during display. The problem of uneven display of the OLED panel due to the IR drop of the cathode is improved.

7 Claims, 10 Drawing Sheets

(51) Int. Cl.
*H01L 51/56* (2006.01)
*H01L 27/12* (2006.01)
*H01L 51/00* (2006.01)

(52) U.S. Cl.
CPC ...... *H01L 27/3258* (2013.01); *H01L 27/3262* (2013.01); *H01L 27/1248* (2013.01); *H01L 27/1262* (2013.01); *H01L 27/3272* (2013.01); *H01L 51/0023* (2013.01); *H01L 51/56* (2013.01); *H01L 2227/323* (2013.01)

(56) References Cited

U.S. PATENT DOCUMENTS

| | | | | |
|---|---|---|---|---|
| 2014/0346453 | A1* | 11/2014 | Koo | H01L 51/5209 |
| | | | | 257/40 |
| 2014/0353609 | A1* | 12/2014 | Song | H01L 27/3276 |
| | | | | 257/40 |
| 2015/0102294 | A1* | 4/2015 | Choi | H01L 51/5203 |
| | | | | 257/40 |
| 2016/0351638 | A1* | 12/2016 | Im | H01L 27/3279 |
| 2017/0186831 | A1* | 6/2017 | Nam | H01L 27/3272 |

* cited by examiner

METHOD OF MANUFACTURING AN OLED PANEL AND AN OLED PANEL

RELATED APPLICATIONS

The present application is a National Phase of International Application Number PCT/CN2017/113673, filed on Nov. 29, 2017, and claims the priority of China Application 201710958776.8, filed on Oct. 13, 2017.

FIELD OF THE DISCLOSURE

The present disclosure relates to a field of a display technique. In particular, it relates to a method of manufacturing an OLED panel and an OLED panel.

BACKGROUND

Organic Light Emitting Display (OLED) has self-luminous, low driving voltage, high luminous efficiency, short response time, sharpness and contrast, nearly 180° viewing angle, wide temperature range, flexible, large-area panchromatic and many other advantages, which is recognized as the most promising display device in the field.

OLED can be classified into passive matrix OLED (PMOLED) and active matrix OLED (AMOLED) according to the driving mode, that is, direct addressing and thin film transistor (TFT) matrix addressing. Among them, AMOLED has a matrix arrangement of pixels, belonging to the active display type with high luminous efficiency, is usually used for high-definition large-size display device.

OLED device usually includes a substrate, an anode provided on the substrate, a hole injection layer provided on the anode, a hole transport layer provided on the hole injection layer, a light emitting layer provided on the hole transport layer, an electron transport layer provided on the light emitting layer, and a cathode provided on the electron transport layer. The principle of light-emitting OLED display device is that the semiconductor material and organic light-emitting material under an electric field driven through a carrier injection and a recombination led to light. Specifically, OLED display device generally adopts an ITO pixel electrode and a metal electrode respectively as the anode and the cathode of the device. Under a certain voltage, the electron and hole are injected from the cathode and the anode into the electron transport layer and the hole transport layer respectively. The electron and hole migrate to the light-emitting layer through the electron transport layer and the hole transport layer, respectively, and meet in the light-emitting layer to excite a light-emitting molecule, which emits visible light through radiation relaxation.

Large-size OLED panels work differently because their cathodes have larger resistances and produce different IR drops at different positions, resulting in uneven brightness of the OLED panel. Therefore, an additional connection to the cathode is required, such that the voltage is applied to the cathode through the auxiliary electrode to solve the problem of display unevenness caused by the IR voltage drop of the cathode and make the display of the OLED panel uniform and stable. In the prior art, a pillar having an inverted trapezoid in longitudinal section is generally fabricated on the OLED panel to achieve the connection between the auxiliary electrode and the cathode. The isolation column has less selectivity of raw materials, increases the cost of the OLED panel. The fabrication process of the panel is therefore complicated, especially for the OLED panel fabricated by the inkjet printing (IJP) method, the process of manufacturing the isolation column is more difficult to realize.

SUMMARY

An objective of the present disclosure is to provide a method of manufacturing an OLED panel having an auxiliary electrode connected to a cathode and capable of improving the display unevenness of the OLED panel due to the IR drop of the cathode.

Another objective of the present disclosure is to provide an OLED panel having an auxiliary electrode connected to a cathode, which can improve the display unevenness of the OLED panel caused by the IR drop of the cathode.

To achieve the above objectives, the present disclosure provides a method of manufacturing an OLED panel, comprising the following steps:

step S1, providing a TFT substrate; the substrate comprising a base substrate, a TFT and an auxiliary electrode disposed on the base substrate at intervals, the TFT having a source electrode;

step S2, patterning a planarization layer formed on the TFT substrate, forming a first via hole and a second via hole on the planarization layer exposing the source electrode and the auxiliary electrode, respectively;

step S3, forming an anode and a strap electrode at intervals on the planarization layer; the anode being connected to the source electrode through the first via hole, the strap electrode being connected to the auxiliary electrode through the second via hole, the strap electrode being formed with a sharp shaped corner;

step S4, forming a pixel defining layer on the planarization layer, the anode, and the strap electrode, the pixel defining layer being provided with a first opening exposing the anode, and the pixel defining layer exposing an area of the sharp shaped corner of the strap electrode;

step S5, sequentially forming a hole injection layer, a hole transport layer and a light-emitting layer on the anode in the first opening; and sequentially forming an electron transport layer, an electron injection layer and a cathode on the light-emitting layer, the pixel definition layer and the strap electrode;

step S6, applying a voltage between the auxiliary electrode and the cathode, so that the electron transport layer and the electron injection layer corresponding to the area of the sharp shaped corner being punctured to directly connect the cathode with the strap electrode.

Herein, a plurality of third via holes are formed on the strap electrode, a tip angle is formed between each side wall of the third via hole and an upper surface of the strap electrode;

the pixel defining layer exposes an area where the plurality of third via holes are formed on the strap electrode;

in the step S5, the electron transport layer, the electron injection layer and the cathode are further formed on the planarization layer exposed from the plurality of third via holes in sequence;

in the step S6, after a voltage is applied between the auxiliary electrode and the cathode, a portion of the electron transport layer and the electron injection layer corresponding to the tip angle formed between the sidewall of the third via hole and the upper surface of the strap electrode is removed to form a plurality of second openings, and the cathode is connected to the strap electrode through the second opening.

Herein, the TFT comprises: an active layer disposed above a base substrate, a gate insulating layer and a gate electrode sequentially disposed on the active layer, an interlayer insulating layer covering the active layer and the gate electrode, and a source electrode and a drain electrode formed on the interlayer insulating layer at intervals;

the auxiliary electrode comprises a first sub-auxiliary electrode disposed on the interlayer insulating layer spacing apart from the source electrode and the drain electrode, the second via hole exposes the first sub-auxiliary electrode;

the interlayer insulating layer is provided with a fourth via hole and a fifth via hole located above both sides of the active layer, the source electrode and the drain electrode are connected to the both sides of the active layer through the fourth via hole and the fifth via hole;

the TFT substrate further comprises a passivation layer covering the interlayer insulating layer, the source electrode, the drain electrode and the first sub-auxiliary electrode, the passivation layer is provided with a seventh via hole and an eighth via hole respectively exposing the source electrode and the first sub-auxiliary electrode; in the step S2, the planarization layer is disposed on the passivation layer, the first via hole and the second via hole are respectively located above the seventh via hole and the eighth via hole.

Herein, the auxiliary electrode further comprises a second sub-auxiliary electrode disposed on the base substrate;

the TFT substrate further comprises: a metal light-shielding layer disposed on the base substrate spacing apart from the second sub-auxiliary electrode, and a buffer layer disposed on the base substrate covering the metal light-shielding layer and the second sub-auxiliary electrode; the active layer is disposed on the buffer layer and correspondingly located above the metal light-shielding layer, the interlayer insulating layer is disposed on the buffer layer covering the active layer and the gate electrode;

the buffer layer and the interlayer insulating layer are provided with a sixth via hole exposing the second sub-auxiliary electrode, the first sub-auxiliary electrode is connected to the second sub-auxiliary electrode through the sixth via hole.

Herein, the plurality of third via holes are arranged in array, and an opening shape of the plurality of third via holes is a rectangle, a triangle, or a circle.

The present disclosure further provides an OLED panel, comprising: a base substrate, a TFT and an auxiliary electrode disposed on the base substrate at intervals, the TFT having a source electrode;

a planarization layer disposed on the TFT substrate, a first via hole and a second via hole formed on the planarization layer exposing the source electrode and the auxiliary electrode, respectively;

an anode disposed on the planarization layer, the anode being connected to the source electrode through the first via hole;

a strap electrode disposed on the planarization layer spacing apart from the anode at intervals, the strap electrode being connected to the auxiliary electrode through the second via hole, the strap electrode being formed with a sharp shaped corner;

a pixel defining layer disposed on the planarization layer, the anode and the strap electrode, the pixel defining layer being provided with a first opening exposing the anode, and the pixel defining layer exposing an area of the sharp shaped corner of the strap electrode;

a hole injection layer, a hole transport layer and a light-emitting layer sequentially disposed on the anode in the first opening;

an electron transport layer, an electron injection layer and a cathode sequentially disposed on the light-emitting layer, the pixel definition layer and the strap electrode; the electron transport layer and the electron injection layer corresponding to the area of the sharp shaped corner being punctured to directly connect the cathode with the strap electrode.

Herein, a plurality of third via holes are formed on the strap electrode, a tip angle is formed between each side wall of the third via hole and an upper surface of the strap electrode;

the pixel defining layer exposes an area where the plurality of third via holes are formed on the strap electrode;

the electron transport layer, the electron injection layer and the cathode are further formed on the planarization layer exposed from the plurality of third via holes in sequence;

a plurality of second openings are disposed on the electron transport layer and the electron injection layer corresponding to the sharp angle formed between the sidewall of the third via hole and the upper surface of the strap electrode, and the cathode is connected to the strap electrode through the second opening.

Herein, the TFT comprises: an active layer disposed above a base substrate, a gate insulating layer and a gate electrode sequentially disposed on the active layer, an interlayer insulating layer covering the active layer and the gate electrode, and a source electrode and a drain electrode formed on the interlayer insulating layer at intervals;

the auxiliary electrode comprises a first sub-auxiliary electrode disposed on the interlayer insulating layer spacing apart from the source electrode and the drain electrode, the second via hole exposes the first sub-auxiliary electrode;

the interlayer insulating layer is provided with a fourth via hole and a fifth via hole located above both sides of the active layer, the source electrode and the drain electrode are connected to the both sides of the active layer through the fourth via hole and the fifth via hole;

the TFT substrate further comprises a passivation layer covering the interlayer insulating layer, the source electrode, the drain electrode and the first sub-auxiliary electrode, the passivation layer is provided with a seventh via hole and an eighth via hole respectively exposing the source electrode and the first sub-auxiliary electrode; the planarization layer is disposed on the passivation layer, the first via hole and the second via hole are respectively located above the seventh via hole and the eighth via hole.

Herein, the auxiliary electrode further comprises a second sub-auxiliary electrode disposed on the base substrate;

the TFT substrate further comprises: a metal light-shielding layer disposed on the base substrate spacing apart from the second sub-auxiliary electrode, and a buffer layer disposed on the base substrate covering the metal light-shielding layer and the second sub-auxiliary electrode; the active layer is disposed on the buffer layer and correspondingly located above the metal light-shielding layer, the interlayer insulating layer is disposed on the buffer layer covering the active layer and the gate electrode;

the buffer layer and the interlayer insulating layer are provided with a sixth via hole exposing the second sub-auxiliary electrode, the first sub-auxiliary electrode is connected to the second sub-auxiliary electrode through the sixth via hole.

Herein, the plurality of third via holes are arranged in array, and an opening shape of the plurality of third via holes is a rectangle, a triangle, or a circle.

The present disclosure further provides a method of manufacturing on OLED panel, comprising the following steps:

step S1, providing a TFT substrate; the substrate comprising a base substrate, a TFT and an auxiliary electrode disposed on the base substrate at intervals, the TFT having a source electrode;

step S2, patterning a planarization layer formed on the TFT substrate, forming a first via hole and a second via hole on the planarization layer exposing the source electrode and the auxiliary electrode, respectively;

step S3, forming an anode and a strap electrode on the planarization layer at intervals; the anode being connected to the source electrode through the first via hole, the strap electrode being connected to the auxiliary electrode through the second via hole, the strap electrode being formed with a sharp shaped corner;

step S4, forming a pixel defining layer on the planarization layer, the anode, and the strap electrode, the pixel defining layer being provided with a first opening exposing the anode, and the pixel defining layer exposing an area of the sharp shaped corner of the strap electrode;

step S5, sequentially forming a hole injection layer, a hole transport layer and a light-emitting layer on the anode in the first opening; and sequentially forming an electron transport layer, an electron injection layer and a cathode on the light-emitting layer, the pixel definition layer and the strap electrode;

step S6, applying a voltage between the auxiliary electrode and the cathode, so that the electron transport layer and the electron injection layer corresponding to the area of the sharp shaped corner being punctured to directly connect the cathode with the strap electrode;

wherein a plurality of third via holes are formed on the strap electrode, a tip angle is formed between each side wall of the third via hole and an upper surface of the strap electrode;

the pixel defining layer exposes an area where the plurality of third via holes are formed on the strap electrode;

in the step S5, the electron transport layer, the electron injection layer and the cathode are further formed on the planarization layer exposed from the plurality of third via holes in sequence;

in the step S6, after a voltage is applied between the auxiliary electrode and the cathode, a portion of the electron transport layer and the electron injection layer corresponding to the tip angle formed between the sidewall of the third via hole and the upper surface of the strap electrode is removed to form a plurality of second openings, and the cathode is connected to the strap electrode through the second opening;

wherein in the TFT comprises: an active layer disposed above a base substrate, a gate insulating layer and a gate electrode sequentially disposed on the active layer, an interlayer insulating layer covering the active layer and the gate electrode, and a source electrode and a drain electrode formed on the interlayer insulating layer at intervals;

the auxiliary electrode comprises a first sub-auxiliary electrode disposed on the interlayer insulating layer spacing apart from the source electrode and the drain electrode, the second via hole exposes the first sub-auxiliary electrode;

the interlayer insulating layer is provided with a fourth via hole and a fifth via hole located above both sides of the active layer, the source electrode and the drain electrode are connected to the both sides of the active layer through the fourth via hole and the fifth via hole;

the TFT substrate further comprises a passivation layer covering the interlayer insulating layer, the source electrode, the drain electrode and the first sub-auxiliary electrode, the passivation layer is provided with a seventh via hole and an eighth via hole respectively exposing the source electrode and the first sub-auxiliary electrode; in the step S2, the planarization layer is disposed on the passivation layer, the first via hole and the second via hole are respectively located above the seventh via hole and the eighth via hole;

wherein the auxiliary electrode further comprises a second sub-auxiliary electrode disposed on the base substrate;

the TFT substrate further comprises: a metal light-shielding layer disposed on the base substrate spacing apart from the second sub-auxiliary electrode, and a buffer layer disposed on the base substrate covering the metal light-shielding layer and the second sub-auxiliary electrode; the active layer is disposed on the buffer layer and correspondingly located above the metal light-shielding layer, the interlayer insulating layer is disposed on the buffer layer covering the active layer and the gate electrode;

the buffer layer and the interlayer insulating layer are provided with a sixth via hole exposing the second sub-auxiliary electrode, the first sub-auxiliary electrode is connected to the second sub-auxiliary electrode through the sixth via hole; and wherein the plurality of third via holes are arranged in array, an opening shape of the third via hole is a rectangle, a triangle, or a circle.

Advantageous effects of the present disclosure are: the present disclosure provides a method of manufacturing an OLED panel in which an anode connected to a source of a TFT, and a strap electrode connected to an auxiliary electrode are formed on a TFT substrate. A sharp shaped corner is formed on the strap electrode, so that an area of the electron transport layer and the electron injection layer to be fabricated subsequently corresponding to the sharp shaped corner have a thinner thickness. By applying a voltage between the auxiliary electrode and the cathode, the electron transport layer and the electron injection layer corresponding to the area of the sharp shaped corner are punctured, so that the cathode is directly connected to the strap electrode and further conducted to the auxiliary electrode, resulting in during a display mode of the OLED panel, a signal is inputted to the cathode through the auxiliary electrode. The problem of uneven display of the OLED panel due to the IR drop of the cathode is improved. The OLED panel provided by the present disclosure has the auxiliary electrode connected to the cathode and can improve the display unevenness of the OLED panel caused by the IR voltage drop of the cathode.

BRIEF DESCRIPTION OF THE DRAWINGS

For further understanding of the features and technical contents of the present disclosure, references are made to the following detailed description and accompanying drawings of the present disclosure. However, the drawings are for reference only and are not intended to limit the present disclosure.

In the drawings.

DETAILED DESCRIPTION OF PREFERRED EMBODIMENTS

To further illustrate the technical means adopted by the present disclosure and the effects thereof, the present disclosure is described in the following preferred embodiments and the accompanying drawings in detail.

Figure 1:
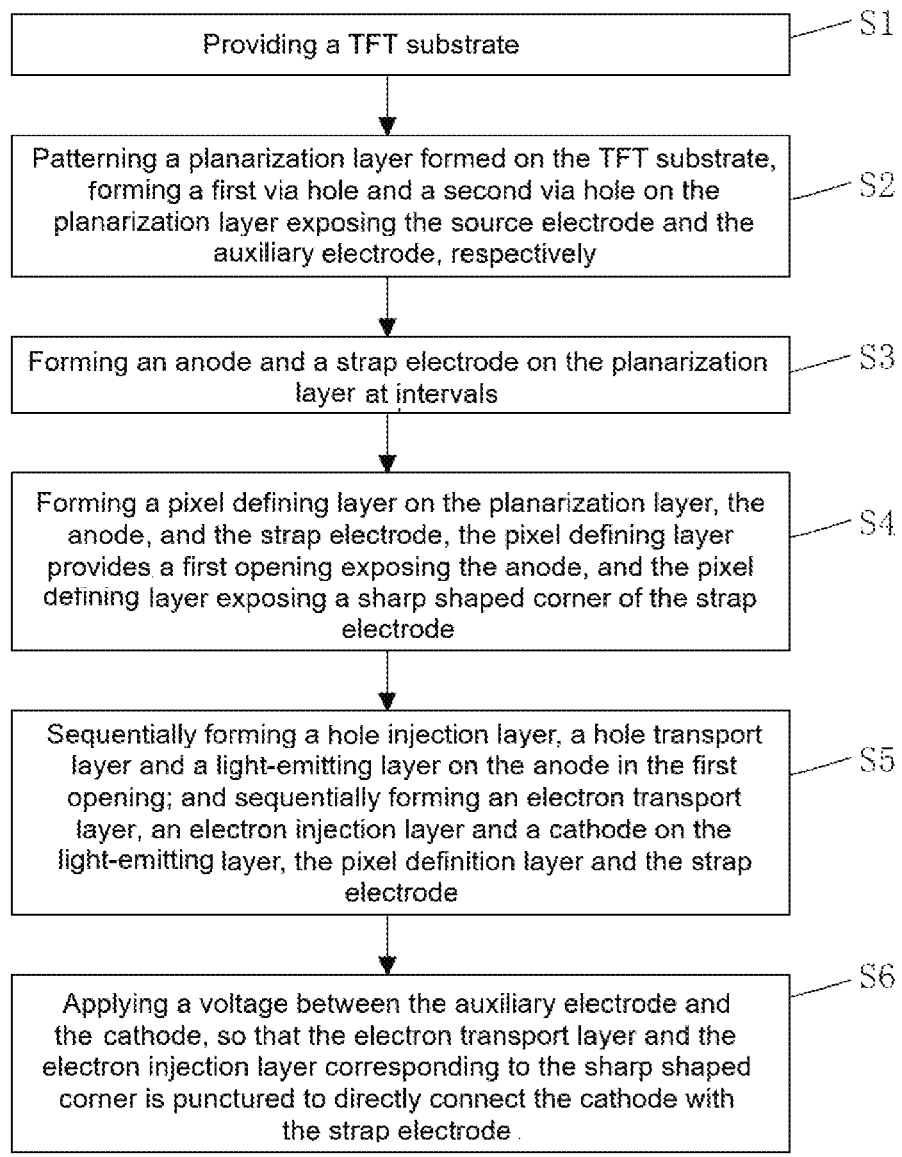
FIG. 1 is a flow chart for a method of manufacturing an OLED panel according to the present disclosure.
Figure 2:
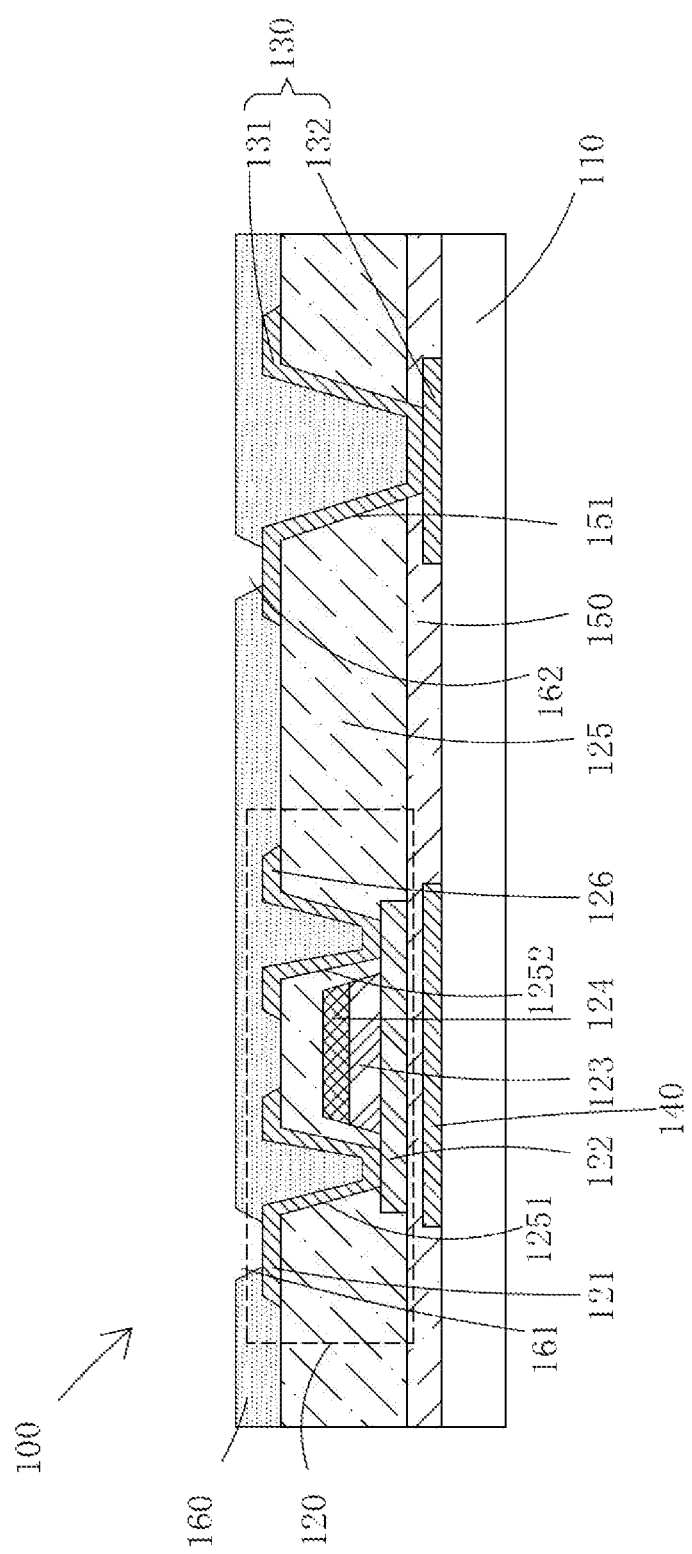
FIG. 2 is a schematic diagram of step S1 in a method of manufacturing an OLED panel according the present disclosure.

Please refer to FIG. 1, the present disclosure provides a method of manufacturing an OLED panel, comprising the following steps:

Step S1, referring to FIG. 2, providing a TFT substrate 100; the substrate 100 comprising a base substrate 110, a TFT 120 and an auxiliary electrode 130 disposed on the base substrate at intervals, the TFT 120 having a source electrode 121.

Specifically, in the embodiment represented by FIG. 2, the TFT 120 is a top gate type TFT, comprising: an active layer 122 disposed on the base substrate 110, a gate insulating layer 123 and a gate electrode 124 sequentially disposed on the active layer 122, an interlayer insulating layer 125 covering the active layer 122 and the gate electrode 124, and a source electrode 121 and a drain electrode 126 formed on the interlayer insulating layer 125 at intervals. It should be noted that the TFT 120 may be a bottom gate type TFT, which does not affect the realization of the present disclosure.

Specifically, the TFT 120 can be a low temperature polysilicon (LTPS) thin film transistor, an oxide semiconductor thin film transistor, a solid phase crystallization (SPC) thin film transistor, or other thin film transistors commonly used in OLED display technology.

Specifically, please refer to FIG. 2, the auxiliary electrode 130 comprises a first sub-auxiliary electrode 131 disposed on the interlayer insulating layer 125 spacing apart from the source electrode 121 and the drain electrode 126.

The interlayer insulating layer 125 is provided with a fourth via hole 1251 and a fifth via hole 1252 located above both sides of the active layer 122, the source electrode 121 and the drain electrode 126 are connected to the both sides of the active layer 122 through the fourth via hole 1251 and the fifth via hole 1252.

Specifically, the auxiliary electrode 130 further comprises a second sub-auxiliary electrode 132 disposed on the base substrate 110.

Specifically, the TFT 120 in FIG. 2 is a top gate type TFT. The TFT substrate 100 further comprises: a metal light-shielding layer 140 disposed on the base substrate 110 spacing apart from the second sub-auxiliary electrode 132, and a buffer layer 150 disposed on the base substrate 110 covering the metal light-shielding layer 140 and the second sub-auxiliary electrode 132; the active layer 122 is disposed on the buffer layer 150 and correspondingly located above the metal light-shielding layer 140, the interlayer insulating layer 125 is disposed on the buffer layer 150 covering the active layer 122 and the gate electrode 124. The buffer layer 150 and the interlayer insulating layer 125 are provided with a sixth via hole 151 exposing the second sub-auxiliary electrode 132, the first sub-auxiliary electrode 131 is connected to the second sub-auxiliary electrode 132 through the sixth via hole 151.

Furthermore, the second sub-auxiliary electrode 132 and the metal light-shielding layer 140 can be formed by the same photomask.

Specifically, please refer to FIG. 2, the TFT 100 further comprises: a passivation layer 160 covering the interlayer insulating layer 125, the source electrode 121, the drain electrode 126 and the first sub-auxiliary electrode 131, the passivation layer 160 is provided with a seventh via hole 161 and an eighth via hole 162 respectively exposing the source electrode 121 and the first sub-auxiliary electrode 131.

Figure 3:
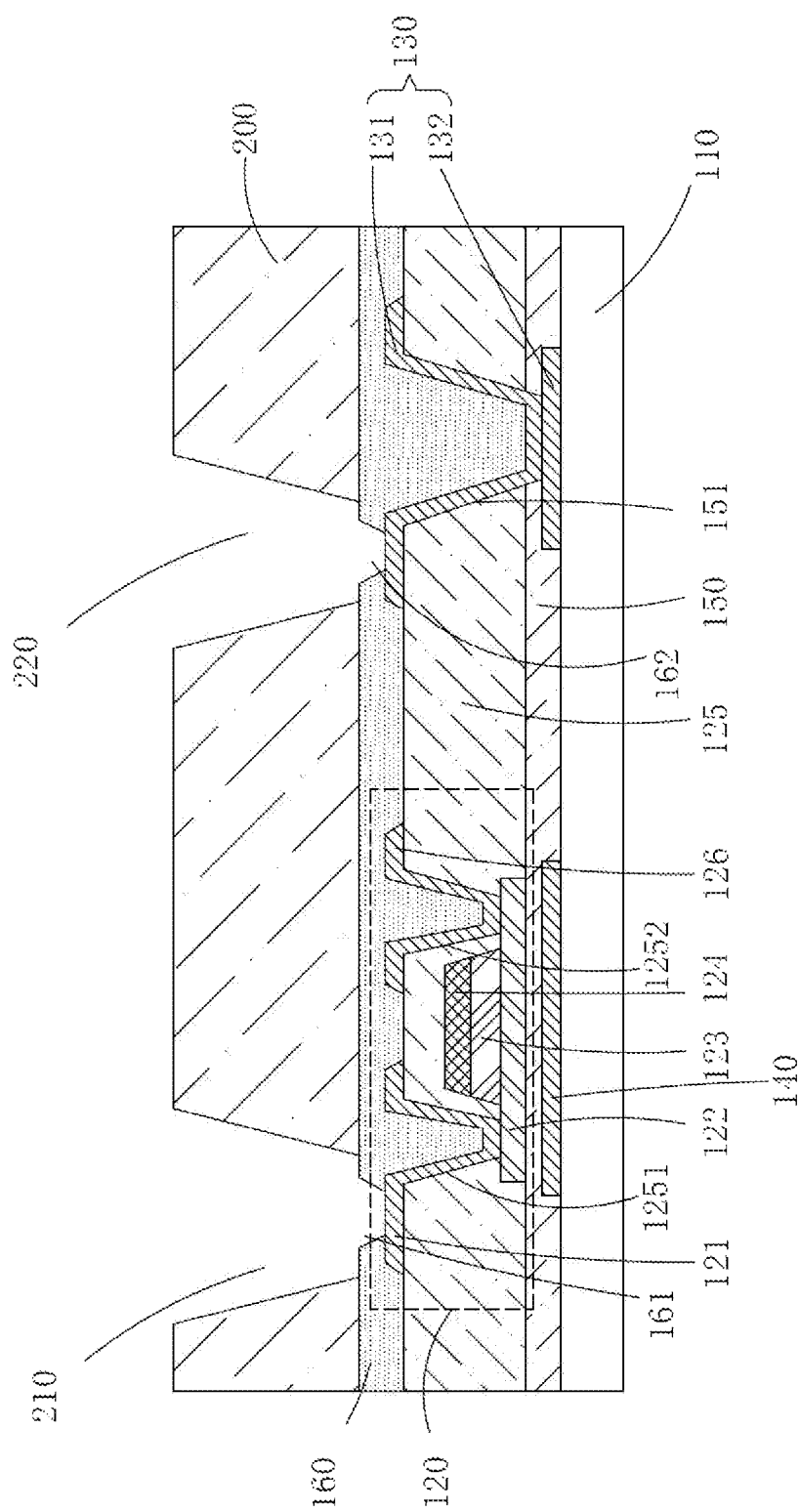
FIG. 3 is a schematic diagram of step S2 in a method of manufacturing an OLED panel according the present disclosure.

Step S2, referring to FIG. 3, forming a planarization layer 200 on the TFT substrate 100, and patterning the planarization layer 200, forming a first via hole 210 and a second via hole 220 on the planarization layer 200 exposing the source electrode 121 and the auxiliary electrode 130, respectively.

Specifically, please refer to FIG. 3, the planarization layer 200 is disposed on the passivation layer 600, the first via hole 210 and the second via hole 220 are respectively located above the seventh via hole 161 and the eighth via hole 162. The second via hole exposes the first sub-auxiliary electrode 131.

Figure 4:
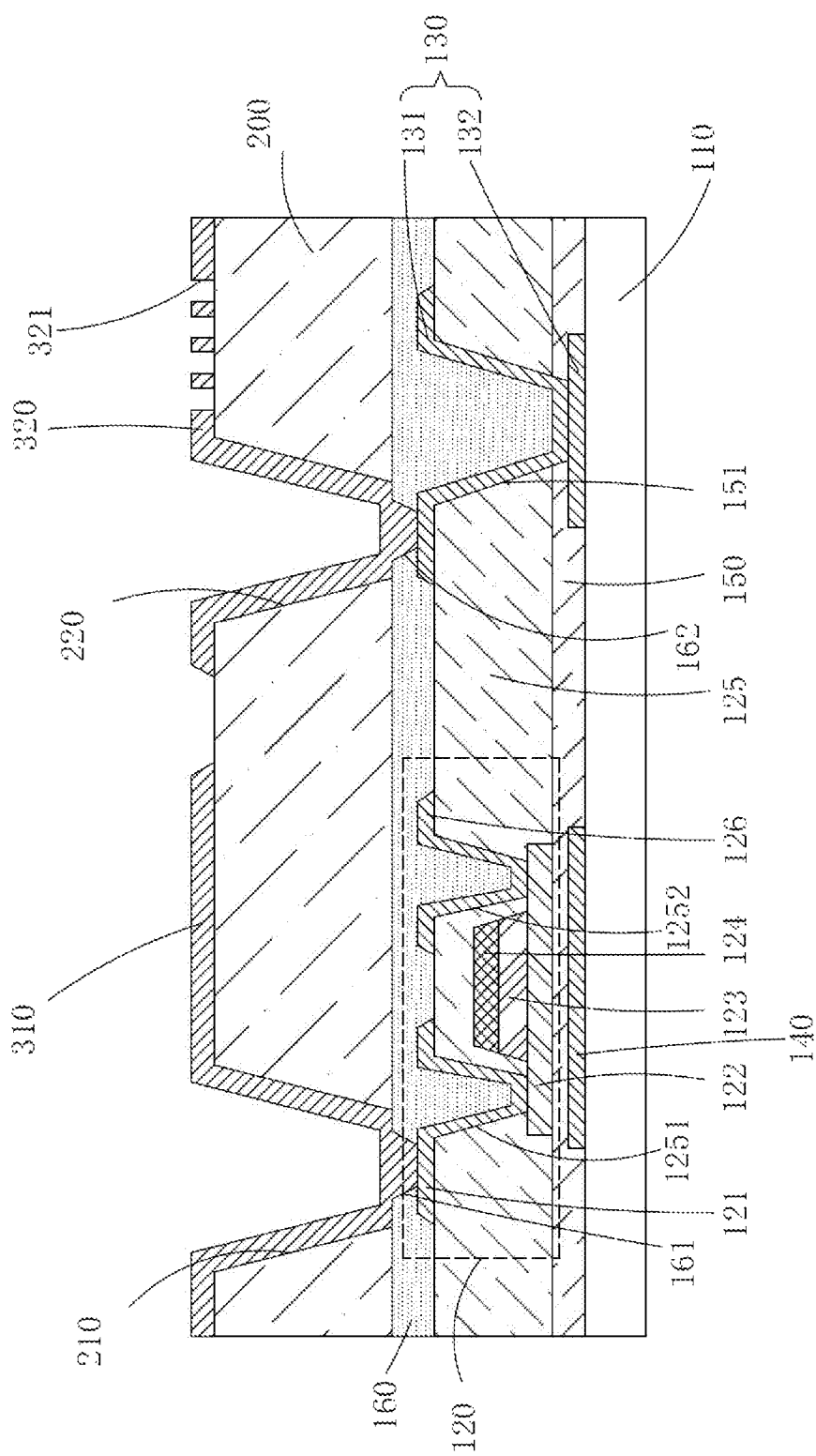
FIG. 4 is a schematic diagram of step S3 in a method of manufacturing an OLED panel according the present disclosure.
Figure 5:
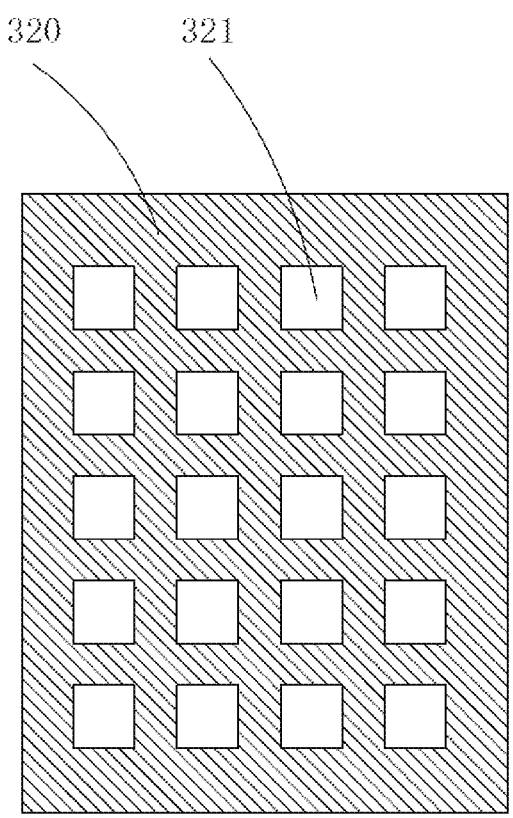
FIG. 5 is a top view schematic diagram of a strap electrode forming a third via hole in step S3 of a method of manufacturing an OLED panel according to the present disclosure.

Step S3, referring to FIGS. 4 and 5, forming an anode 310 and a strap electrode 320 on the planarization layer 200 at intervals. The anode 310 is connected to the source electrode 121 through the first via hole 210, the strap electrode 320 is connected to the auxiliary electrode 130 through the second via hole 220. The strap electrode being 320 is formed with a sharp shaped corner.

Specifically, please refer to FIG. 5, a plurality of third via holes 321 are formed on the strap electrode 320, a tip angle is formed between each side wall of the third via hole 321 and an upper surface of the strap electrode 320.

Preferably, please refer to FIG. 5, the plurality of third via holes 321 are arranged in array, in order to connect a cathode formed afterward with the strap electrode 320 uniformly.

Specifically, in the embodiment of FIG. 5, an opening shape of the plurality of third via holes 321 is rectangle, which leading a region of the strap electrode 320 formed with the plurality of third via holes 321 becomes a grid structure. Of course, the opening shape of the third via hole 321 is not limited to a rectangle, triangle, circular, or other shapes can also be selected according to actual product requirements. Also, the opening shape of the plurality of third via holes 321 may be the same or different, which does not affect the implementation of the present invention.

Specifically, the anode 310 and the strap electrode 320 may adopt same or different material and thickness.

Figure 6:
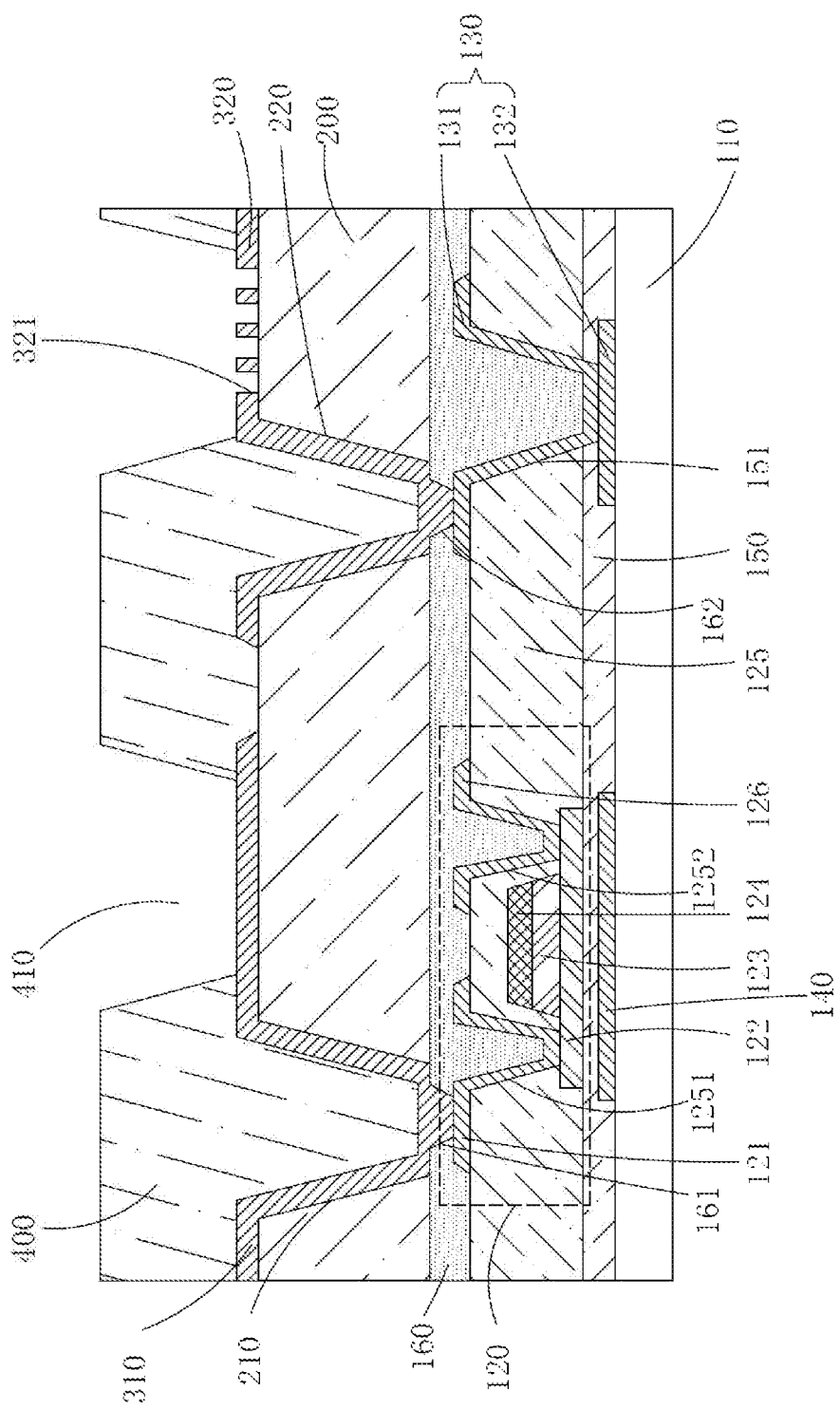
FIG. 6 is a schematic diagram of step S4 in a method of manufacturing an OLED panel according the present disclosure.

Further, when the anode 310 and the strap electrode 320 are made of the same material and the same thickness, an anode material layer is patterned by forming an anode material layer on the planarization layer 200 to obtain the anode 310 and the strap electrode 320, moreover the strap electrode 320 forms with a sharp shaped corner.

step S4, referring to FIG. 6, forming a pixel defining layer 400 on the planarization layer 200, the anode 310, and the strap electrode 320. The pixel defining layer 400 is provided with a first opening 410 exposing the anode 310, and the pixel defining layer 400 exposing an area of the sharp shaped corner of the strap electrode 320.

Specifically, the pixel defining layer 400 exposes an area where the plurality of third via holes 321 are formed on the strap electrode 320.

Specifically, the first opening 410 defines a pixel area of the OELD panel.

Specifically, the hydrophilicity and hydrophobicity of the pixel definition layer 400 are determined according to the following process of manufacturing the OLED functional layer (hole injection layer, hole transport layer, light-emitting layer, electron transport layer and electron injection layer) in the first opening 410. When the OLED functional layer is formed by vapor deposition in the first opening 410, a conventional non-hydrophobic is selected for the pixel definition layer 400; when the OLED functional layer is subsequently manufactured by inkjet printing in the first opening 410, a conventional hydrophobic material is selected for the pixel definition layer 400.

Figure 7:
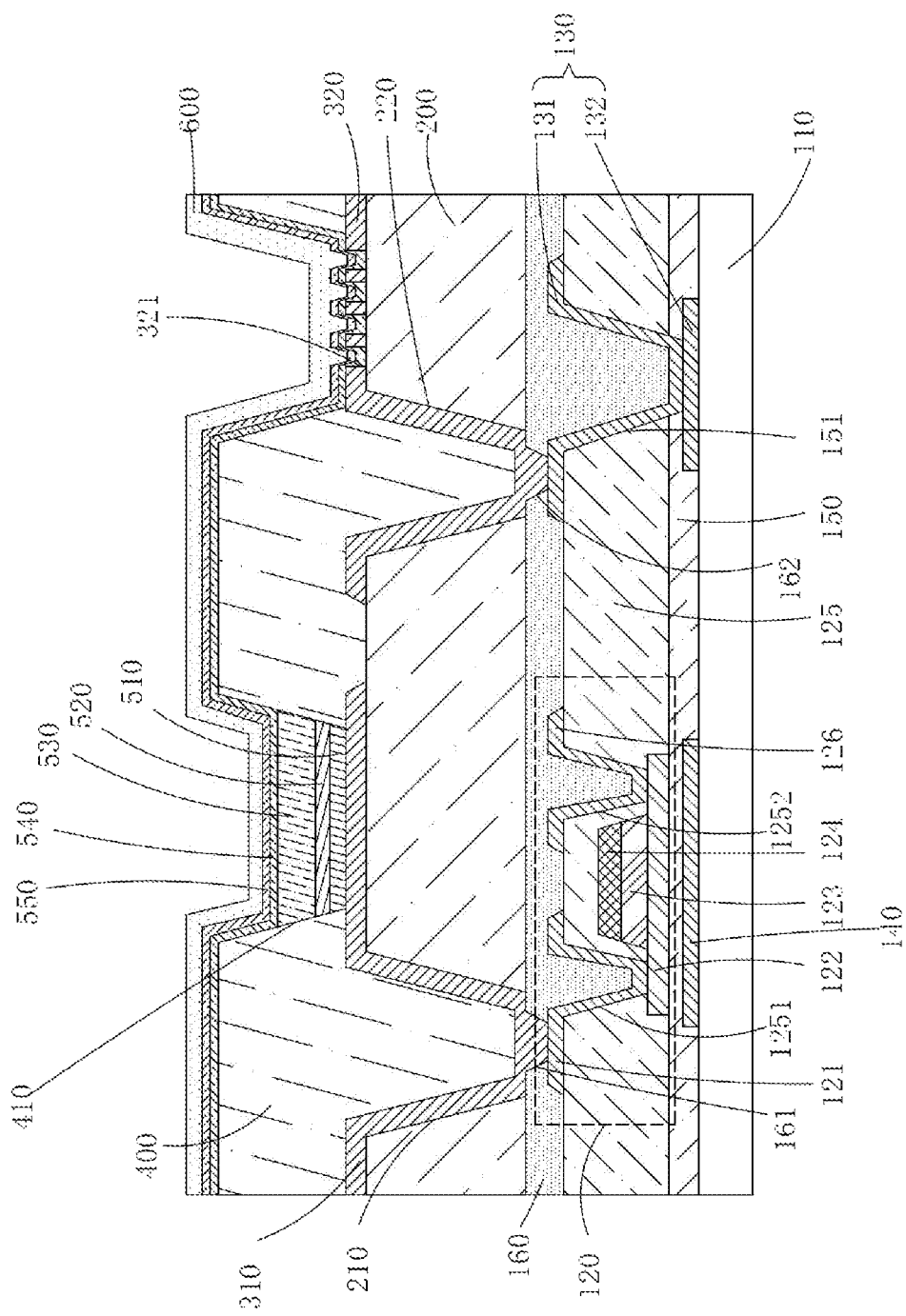
FIG. 7 is a schematic diagram of step S5 in a method of manufacturing an OLED panel according the present disclosure.
Figure 8:
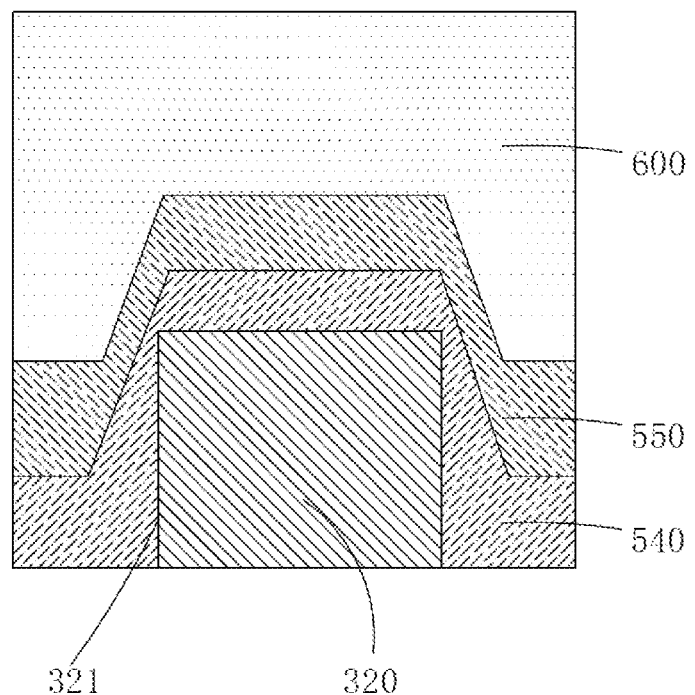
FIG. 8 is an enlarged schematic diagram of a location of the third via hole after step S5 of a method of manufacturing an OLED panel according the present disclosure.

Step S5, referring to FIGS. 7 and 8, sequentially forming a hole injection layer 510, a hole transport layer 520 and a light-emitting layer 530 on the anode 310 in the first opening 410; and sequentially forming an electron transport layer 540, an electron injection layer 550 and a cathode 600 on the light-emitting layer 530, the pixel definition layer 400 and the strap electrode 320

Specifically, please refer to FIGS. 7 and 8, in the step S5, the electron transport layer 540, the electron injection layer 550 and the cathode 600 are further formed on the planarization layer 200 exposed from the plurality of third via holes 321 in sequence.

Specifically, please refer to FIG. 8, the strap electrode 320 is formed with the sharp shaped corner, in particular, a plurality of third via holes 321 are formed, and the sidewalls of each of the third via holes 321 form a sharp shaped corner with the upper surface of the strap electrode 320. Therefore, after the electron transport layer 540 and the electron injection layer 550 are sequentially formed on the strap electrode 320, the electron transport layer 540 and the electron injection layer 550 on an area corresponding to the sharp shaped corner, that is a tip angle formed between the side wall of the third via hole 321 and the strap electrode 320 has a thinner thickness of thin film.

Figure 9:
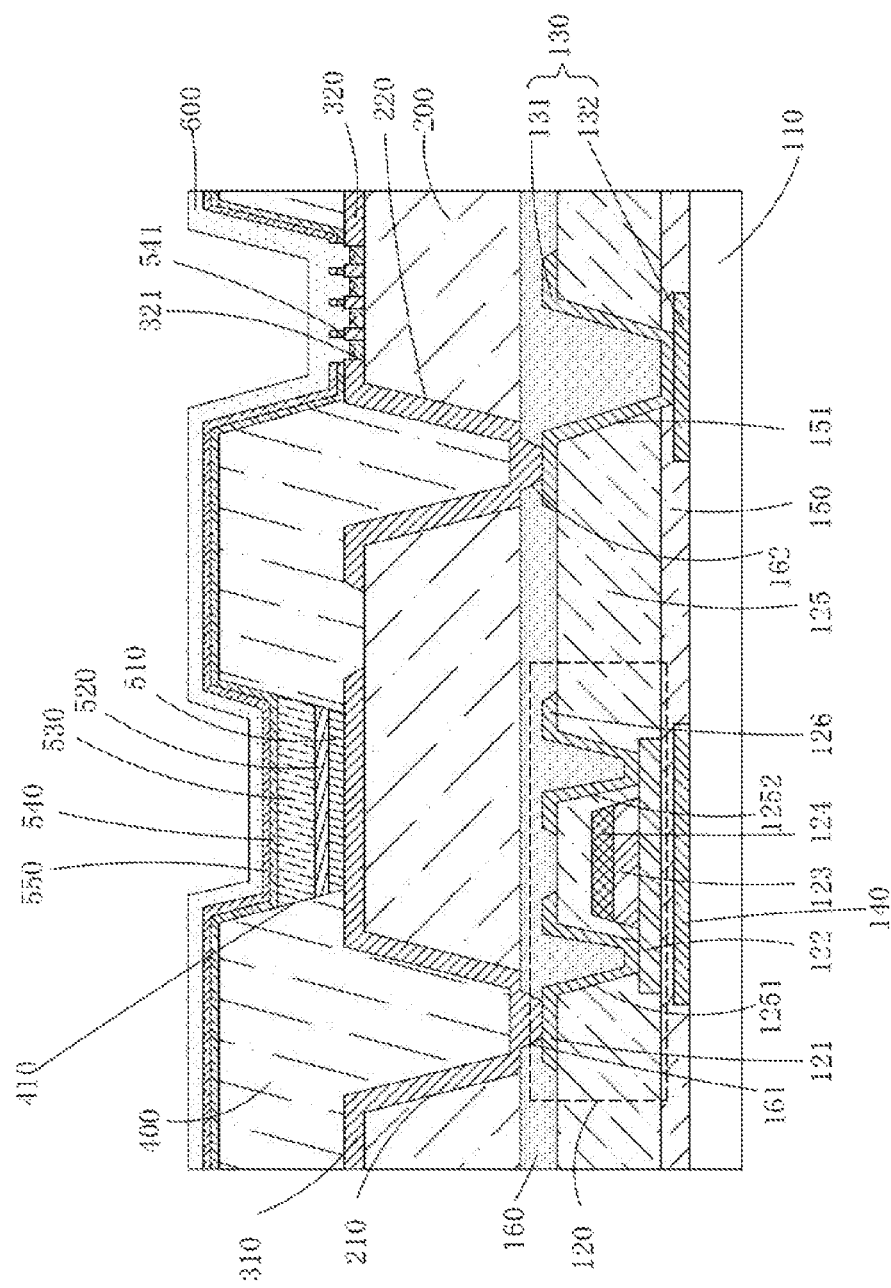
FIG. 9 is a schematic diagram of step S6 in a method of manufacturing an OLED panel, and an OLED panel according the present disclosure.
Figure 10:
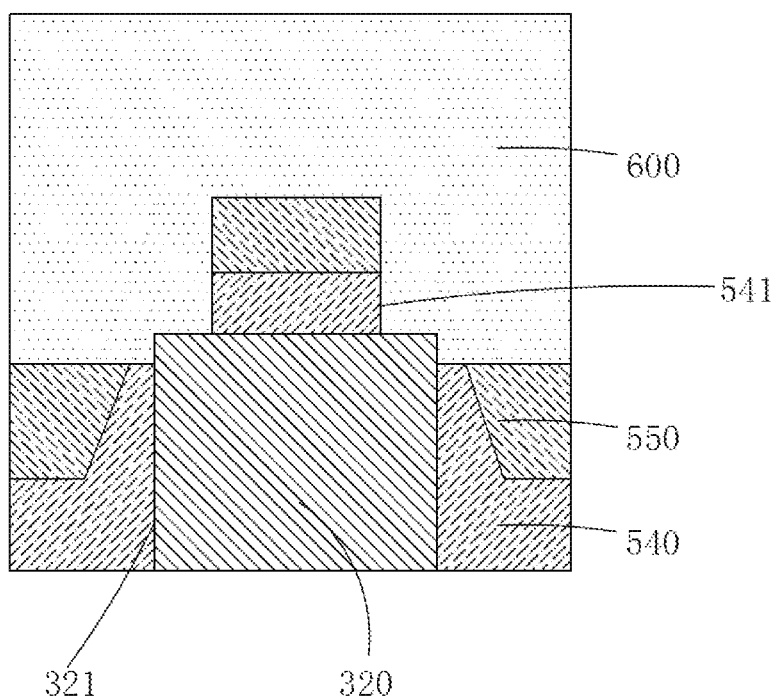
FIG. 10 is an enlarged schematic diagram of a location of the third via hole after step S6 of a method of manufacturing an OLED panel according the present disclosure.

Step S6, referring to FIGS. 9 and 10, applying a voltage between the auxiliary electrode 130 and the cathode 600, so that the electron transport layer 540 and the electron injection layer 550 corresponding to the area of the sharp shaped corner is punctured to directly connect the cathode 600 with the strap electrode 320.

Specifically, in the step S6, after a voltage is applied between the auxiliary electrode 130 and the cathode 600, a portion of the electron transport layer 540 and the electron injection layer 550 corresponding to the tip angle formed between the sidewall of the third via hole 321 and the upper surface of the strap electrode 320 is removed to form a plurality of second openings 541, and the cathode 600 is connected to the strap electrode 320 through the second opening 541.

Preferably, the voltage is applied between the first sub-auxiliary electrode 131 and the cathode 600.

It should be noted that since the thickness of the area corresponding to the sharp shaped corner, that is the tip angle formed between the side wall of the third via hole 321 and the strap electrode 320 is thinner, when a voltage is applied between the auxiliary electrode 130 and the cathode 600, after the voltage is applied to the auxiliary electrode 130 and the strap electrode 320, an electric field is occurred between the auxiliary electrode 130 and the strap electrode 320 and the cathode 600. The electron transport layer 540 and the electron injection layer 550 corresponding to the area of sharp shaped corner are punctured, that is, the portion corresponding to the tip angle formed between the side wall of the third via hole 321 and the strap electrode 320 is removed to form the plurality of second openings 541. Such that, the cathode 600 and the strap electrode 320 are connected to each other, the electrical connection between the cathode 600, the strap electrode 320 and the auxiliary electrode 130 is turned on, resulting in during a display mode of the OLED panel, a signal can be inputted to the cathode 600 through the auxiliary electrode 130 to achieve the effect of improving the display unevenness of the OLED panel due to the IR drop of the cathode 600.

Please refer to FIGS. 9 and 10, in combination with FIG. 5, based on the same inventive concept, the present disclosure further provides an OLED panel produced by the above method of manufacturing an OLED panel, which comprising:

TFT substrate 100, the TFT substrate 100 including a base substrate 110, a TFT 120 and an auxiliary electrode 130 disposed on the base substrate 110 at intervals, the TFT 120 having a source electrode 121;

a planarization layer 200 disposed on the TFT substrate 100, a first via hole 210 and a second via hole 220 formed on the planarization layer 220 exposing the source electrode 121 and the auxiliary electrode 130, respectively;

an anode 310 disposed on the planarization layer 200, the anode 300 being connected to the source 121 electrode through the first via hole 210;

a strap electrode 320 disposed on the planarization layer 200 spacing apart from the anode 310 at intervals, the strap electrode 320 being connected to the auxiliary electrode 130 through the second via hole 220, the strap electrode 320 being formed with a sharp shaped corner;

a pixel defining layer 400 disposed on the planarization layer 200, the anode 310 and the strap electrode 320, the pixel defining layer 400 being provided with a first opening 410 exposing the anode 300, and the pixel defining layer 400 exposing an area of the sharp shaped corner of the strap electrode 320;

a hole injection layer 510, a hole transport layer 520 and a light-emitting layer 530 sequentially disposed on the anode in the first opening 410;

an electron transport layer 540, an electron injection layer 550 and a cathode 600 sequentially disposed on the light-emitting layer 530, the pixel definition layer 400 and the strap electrode 320; the electron transport layer 540 and the electron injection layer 550 corresponding to the area of the sharp shaped corner being punctured to directly connect the cathode 600 with the strap electrode 320.

Specifically, a plurality of third via holes 321 are formed on the strap electrode 320, a tip angle is formed between each side wall of the third via hole 321 and an upper surface of the strap electrode 320. The pixel defining layer 400 exposes an area where the plurality of third via holes 321 are formed on the strap electrode 320. The electron transport layer 540, the electron injection layer 550 and the cathode 600 are further formed on the planarization layer 200 exposed from the plurality of third via holes 321 in sequence. A plurality of second openings 541 are disposed on the electron transport layer 540 and the electron injection layer 550 corresponding to the sharp angle formed between the sidewall of the third via hole 321 and the upper surface of the strap electrode 320. And, the cathode 600 is connected to the strap electrode 320 through the second opening 541.

Specifically, in the embodiment of FIG. 5, an opening shape of the plurality of third via holes 321 is rectangle, which leading a region of the strap electrode 320 formed with the plurality of third via holes 321 becomes a grid structure. Of course, the opening shape of the third via hole 321 is not limited to a rectangle, triangle, circular, or other shapes can also be selected according to actual product requirements. Also, the opening shape of the plurality of third via holes 321 may be the same or different, which does not affect the implementation of the present invention.

Specifically, in the embodiment represented by FIG. 9, the TFT 120 is a top gate type TFT, comprising: an active layer 122 disposed on the base substrate 110, a gate insulating layer 123 and a gate electrode 124 sequentially disposed on the active layer 122, an interlayer insulating layer 125 covering the active layer 122 and the gate electrode 124, and a source electrode 121 and a drain electrode 126 formed on the interlayer insulating layer 125 at intervals. It should be noted that the TFT 120 may be a bottom gate type TFT, which does not affect the realization of the present disclosure.

Specifically, the TFT 120 can be a low temperature polysilicon (LTPS) thin film transistor, an oxide semiconductor thin film transistor, a solid phase crystallization (SPC) thin film transistor, or other thin film transistors commonly used in OLEO display technology.

Specifically, please refer to FIG. 9, the auxiliary electrode 130 comprises a first sub-auxiliary electrode 131 disposed on the interlayer insulating layer 125 spacing apart from the source electrode 121 and the drain electrode 126.

The interlayer insulating layer 125 is provided with a fourth via hole 1251 and a fifth via hole 1252 located above both sides of the active layer 122, the source electrode 121 and the drain electrode 126 are connected to the both sides of the active layer 122 through the fourth via hole 1251 and the fifth via hole 1252.

Specifically, the auxiliary electrode 130 further comprises a second sub-auxiliary electrode 132 disposed on the base substrate 110.

Specifically, the TFT 120 in FIG. 9 is a top gate type TFT. The TFT substrate 100 further comprises: a metal light-shielding layer 140 disposed on the base substrate 110 spacing apart from the second sub-auxiliary electrode 132, and a buffer layer 150 disposed on the base substrate 110 covering the metal light-shielding layer 140 and the second sub-auxiliary electrode 132; the active layer 122 is disposed on the buffer layer 150 and correspondingly located above the metal light-shielding layer 140, the interlayer insulating layer 125 is disposed on the buffer layer 150 covering the active layer 122 and the gate electrode 124. The buffer layer 150 and the interlayer insulating layer 125 are provided with a sixth via hole 151 exposing the second sub-auxiliary electrode 132, the first sub-auxiliary electrode 131 is connected to the second sub-auxiliary electrode 132 through the sixth via hole 151.

Specifically, please refer to FIG. 9, the TFT substrate further comprises: a passivation layer 160 covering the interlayer insulating layer 125, the source electrode 121, the drain electrode 126 and the first sub-auxiliary electrode 131, the passivation layer 160 is provided with a seventh via hole 161 and an eighth via hole 162 respectively exposing the source electrode 121 and the first sub-auxiliary electrode 131.

Specifically, please refer to FIG. 9, the planarization layer 200 is formed on the passivation layer 160, the first via hole 210 and the second via hole 220 are respectively located on the seventh via hole 161 and an eighth via hole 162, and the second via hole 220 exposes the first sub-auxiliary electrode 131.

Specifically, please refer to FIG. 5, the plurality of third via hole 321 are arranged in array, in order to connect a cathode formed afterward with the strap electrode 320 uniformly.

Specifically, the anode 310 and the strap electrode 320 may adopt same or different material and thickness.

Specifically, the first opening 410 defines a pixel area of an OLED panel.

Specifically, the hydrophilicity and hydrophobicity of the pixel definition layer 400 are determined according to the following process of manufacturing the OLED functional layer (hole injection layer, hole transport layer, light-emitting layer, electron transport layer and electron injection layer) in the first opening 410. When the OLED functional layer is formed by vapor deposition in the first opening 410, a conventional non-hydrophobic is selected for the pixel definition layer 400; when the OLED functional layer is subsequently manufactured by inkjet printing in the first opening 410, a conventional hydrophobic material is selected for the pixel definition layer 400.

It should be noted that, please refer to FIGS. 9 and 10, in combination with FIG. 8, in the present disclosure, since the corner of the strap electrode 320 has a sharp shape, specifically, forming the plurality of third via holes 321, and the tip angle formed between the side wall of the third via hole 321 and the strap electrode 320, after the electron transport layer 540 and the electron injection layer 550 are sequentially formed on the strap electrode 320, the electron transport layer 540 and the electron injection layer 550 in an area corresponding to the sharp shaped corner, that is an area corresponding to the tip angle formed between the sidewall of the third via hole 321 and the upper surface of the strap electrode 320 has thinner thickness. Such that, is it able to apply a voltage between the auxiliary electrode 130 and the cathode 600, and break the electron transport layer 540 and the electron injection layer 550 in the sharp shaped area, that is, to remove the portions of the electron transport layer 540 and the electron injection layer 550 corresponding to the sharp shaped corner between the sidewall of the third via hole 321 and the upper surface of the strap electrode 320, and therefore to form the plurality of second opening 541, leading the cathode 600 and the strap electrode are directly connected, and resulting in the electrical connection between the cathode 600, the strap electrode 320 and the auxiliary electrode 130 are turned on. A signal is capable inputted to the cathode through the auxiliary electrode during a display period of the OLED panel, the uneven display problem of the OLED panel due to the IR drop of the cathode 600 is improved.

In summary, in the method of manufacturing an OLED panel of the present disclosure, an anode connected to a source of a TFT, and a strap electrode connected to an auxiliary electrode are formed on a TFT substrate. A sharp shaped corner is formed on the strap electrode, so that an area of the electron transport layer and the electron injection layer to be fabricated subsequently corresponding to the sharp shaped corner have a thinner thickness. By applying a voltage between the auxiliary electrode and the cathode, the electron transport layer and the electron injection layer corresponding to the area of the sharp shaped corner are punctured, so that the cathode is directly connected to the strap electrode and further conducted to the auxiliary electrode, resulting in during a display mode of the OLED panel, a signal is inputted to the cathode through the auxiliary electrode. The problem of uneven display of the OLED panel due to the IR drop of the cathode is improved. The OLED panel provided by the present disclosure has the auxiliary electrode connected to the cathode and can improve the display unevenness of the OLED panel caused by the IR voltage drop of the cathode. The OLED panel provided by the present disclosure has the auxiliary electrode connected to the cathode and can improve the display unevenness of the OLED panel caused by the IR voltage drop of the cathode.

Finally, it should be noted that the above embodiments are merely illustrative of the technical solutions of the present disclosure and are not intended to be limiting thereof. For the person skilled in the art of the disclosure, without departing from the concept of the disclosure, simple deductions or substitutions can be made and should be included in the protection scope of the disclosure.

What is claimed is:

1. A method of manufacturing an OLED panel, comprising the following steps:
   step S1, providing a TFT substrate; the substrate comprising a base substrate, a TFT and an auxiliary electrode disposed on the base substrate at intervals, the TFT having a source electrode;
   step S2, patterning a planarization layer formed on the TFT and the auxiliary electrode, forming a first via hole and a second via hole on the planarization layer exposing the source electrode and the auxiliary electrode, respectively;
   step S3, forming an anode and a strap electrode directly on the planarization layer at intervals; the anode and the strap electrode being in contacted with the planarization layer; the anode being connected to the source electrode through the first via hole, the strap electrode being connected to the auxiliary electrode through the second via hole, the strap electrode being formed with a sharp shaped corner;
   step S4, forming a pixel defining layer on the planarization layer, the anode, and the strap electrode, the pixel defining layer being provided with a first opening exposing the anode, and the pixel defining layer exposing an area of the sharp shaped corner of the strap electrode;
   step S5, sequentially forming a hole injection layer, a hole transport layer and a light-emitting layer on the anode in the first opening; and sequentially forming an electron transport layer, an electron injection layer and a cathode on the light-emitting layer, the pixel definition layer and the strap electrode, wherein the sharp shaped corner of the strap electrode is in a state of being spaced from the cathode by the electron transport layer and the electron injection layer, the electron transport layer and the electron injection layer corresponding to the area of the sharp shaped corner have a thinner thickness;
   step S6, applying a voltage between the auxiliary electrode and the cathode to generate an electric field between the strap electrode and the cathode, and thereby the electron transport layer and the electron injection layer corresponding to the area of the sharp shaped corner being punctured under the electric field, and the sharp shaped corner being changed from the state of being spaced from the cathode to be a state of being directly connected with the cathode.

2. The method of manufacturing an OLED panel according to claim 1, wherein a plurality of third via holes are formed on the strap electrode, a tip angle is formed between each side wall of the third via hole and an upper surface of the strap electrode;
   the pixel defining layer exposes an area where the plurality of third via holes are formed on the strap electrode;
   in the step S5, the electron transport layer, the electron injection layer and the cathode are further formed on the planarization layer exposed from the plurality of third via holes in sequence;
   in the step S6, after a voltage is applied between the auxiliary electrode and the cathode, a portion of the electron transport layer and the electron injection layer corresponding to the tip angle formed between the sidewall of the third via hole and the upper surface of the strap electrode is removed to form a plurality of second openings, and the cathode is connected to the strap electrode through the second opening.

3. The method of manufacturing an OLED panel according to claim 1, wherein the TFT comprises: an active layer disposed above the base substrate, a gate insulating layer and a gate electrode sequentially disposed on the active layer, an interlayer insulating layer covering the active layer and the gate electrode, and a source electrode and a drain electrode formed on the interlayer insulating layer at intervals;
   the auxiliary electrode comprises a first sub-auxiliary electrode disposed on the interlayer insulating layer spacing apart from the source electrode and the drain electrode, the second via hole exposes the first sub-auxiliary electrode;
   the interlayer insulating layer is provided with a fourth via hole and a fifth via hole located above both sides of the active layer, the source electrode and the drain electrode are connected to the both sides of the active layer through the fourth via hole and the fifth via hole;
   the TFT substrate further comprises a passivation layer covering the interlayer insulating layer, the source electrode, the drain electrode and the first sub-auxiliary electrode, the passivation layer is provided with a seventh via hole and an eighth via hole respectively exposing the source electrode and the first sub-auxiliary electrode; in the step S2, the planarization layer is disposed on the passivation layer, the first via hole and the second via hole are respectively located above the seventh via hole and the eighth via hole.

4. The method of manufacturing an OLED panel according to claim 3, wherein the auxiliary electrode further comprises a second sub-auxiliary electrode disposed on the base substrate;
   the TFT substrate further comprises: a metal light-shielding layer disposed on the base substrate spacing apart from the second sub-auxiliary electrode, and a buffer layer disposed on the base substrate covering the metal light-shielding layer and the second sub-auxiliary electrode; the active layer is disposed on the buffer layer and correspondingly located above the metal light-shielding layer, the interlayer insulating layer is disposed on the buffer layer covering the active layer and the gate electrode;

the buffer layer and the interlayer insulating layer are provided with a sixth via hole exposing the second sub-auxiliary electrode, the first sub-auxiliary electrode is connected to the second sub-auxiliary electrode through the sixth via hole.

5. The method of manufacturing an OLED panel according to claim 2, wherein the plurality of third via holes are arranged in array, and an opening shape of the plurality of third via holes is a rectangle, a triangle, or a circle.

6. A method of manufacturing an OLED panel, comprising the following steps:

step S1, providing a TFT substrate; the substrate comprising a base substrate, a TFT and an auxiliary electrode disposed on the base substrate at intervals, the TFT having a source electrode;

step S2, patterning a planarization layer formed on the TFT substrate, forming a first via hole and a second via hole on the planarization layer exposing the source electrode and the auxiliary electrode, respectively;

step S3, forming an anode and a strap electrode directly on the planarization layer at intervals; the anode and the strap electrode being in contacted with the planarization layer; the anode being connected to the source electrode through the first via hole, the strap electrode being connected to the auxiliary electrode through the second via hole, the strap electrode being formed with a sharp shaped corner;

step S4, forming a pixel defining layer on the planarization layer, the anode, and the strap electrode, the pixel defining layer being provided with a first opening exposing the anode, and the pixel defining layer exposing an area of the sharp shaped corner of the strap electrode;

step S5, sequentially forming a hole injection layer, a hole transport layer and a light-emitting layer on the anode in the first opening; and sequentially forming an electron transport layer, an electron injection layer and a cathode on the light-emitting layer, the pixel definition layer and the strap electrode, wherein the sharp shaped corner of the strap electrode is in a state of being spaced from the cathode by the electron transport layer and the electron injection layer, the electron transport layer and the electron injection layer corresponding to the area of the sharp shaped corner have a thinner thickness;

step S6, applying a voltage between the auxiliary electrode and the cathode to generate an electric field between the strap electrode and the cathode, and thereby the electron transport layer and the electron injection layer corresponding to the area of the sharp shaped corner being punctured under the electric field, and the sharp shaped corner being changed from the state of being spaced from the cathode to be a state of being directly connected with the cathode;

wherein a plurality of third via holes are formed on the strap electrode, a tip angle is formed between each side wall of the third via hole and an upper surface of the strap electrode;

the pixel defining layer exposes an area where the plurality of third via holes are formed on the strap electrode;

in the step S5, the electron transport layer, the electron injection layer and the cathode are further formed on the planarization layer exposed from the plurality of third via holes in sequence;

in the step S6, after a voltage is applied between the auxiliary electrode and the cathode, a portion of the electron transport layer and the electron injection layer corresponding to the tip angle formed between the sidewall of the third via hole and the upper surface of the strap electrode is removed under the electric field to form a plurality of second openings, and the cathode is connected to the strap electrode through the second opening;

wherein in the TFT comprises: an active layer disposed above the base substrate, a gate insulating layer and a gate electrode sequentially disposed on the active layer, an interlayer insulating layer covering the active layer and the gate electrode, and a source electrode and a drain electrode formed on the interlayer insulating layer at intervals;

the auxiliary electrode comprises a first sub-auxiliary electrode disposed on the interlayer insulating layer spacing apart from the source electrode and the drain electrode, the second via hole exposes the first sub-auxiliary electrode;

the interlayer insulating layer is provided with a fourth via hole and a fifth via hole located above both sides of the active layer, the source electrode and the drain electrode are connected to the both sides of the active layer through the fourth via hole and the fifth via hole;

the TFT substrate further comprises a passivation layer covering the interlayer insulating layer, the source electrode, the drain electrode and the first sub-auxiliary electrode, the passivation layer is provided with a seventh via hole and an eighth via hole respectively exposing the source electrode and the first sub-auxiliary electrode; in the step S2, the planarization layer is disposed on the passivation layer, the first via hole and the second via hole are respectively located above the seventh via hole and the eighth via hole;

wherein the auxiliary electrode further comprises a second sub-auxiliary electrode disposed on the base substrate;

the TFT substrate further comprises: a metal light-shielding layer disposed on the base substrate spacing apart from the second sub-auxiliary electrode, and a buffer layer disposed on the base substrate covering the metal light-shielding layer and the second sub-auxiliary electrode; the active layer is disposed on the buffer layer and correspondingly located above the metal light-shielding layer, the interlayer insulating layer is disposed on the buffer layer covering the active layer and the gate electrode;

the buffer layer and the interlayer insulating layer are provided with a sixth via hole exposing the second sub-auxiliary electrode, the first sub-auxiliary electrode is connected to the second sub-auxiliary electrode through the sixth via hole; and wherein the plurality of third via holes are arranged in array, and an opening shape of the plurality of third via holes is a rectangle, a triangle, or a circle.

7. A method of manufacturing an OLED panel, comprising the following steps:

step S1, providing a TFT substrate; the substrate comprising a base substrate, a TFT and an auxiliary electrode disposed on the base substrate at intervals, the TFT having a source electrode;

step S2, patterning a planarization layer formed on the TFT substrate, forming a first via hole and a second via hole on the planarization layer exposing the source electrode and the auxiliary electrode, respectively;

step S3, forming an anode and a strap electrode on the planarization layer at intervals; the anode being connected to the source electrode through the first via hole, the strap electrode being connected to the auxiliary electrode through the second via hole, the strap electrode being formed with a sharp shaped corner;

step S4, forming a pixel defining layer on the planarization layer, the anode, and the strap electrode, the pixel defining layer being provided with a first opening exposing the anode, and the pixel defining layer exposing an area of the sharp shaped corner of the strap electrode;

step S5, sequentially forming a hole injection layer, a hole transport layer and a light-emitting layer on the anode in the first opening; and sequentially forming an electron transport layer, an electron injection layer and a cathode on the light-emitting layer, the pixel definition layer and the strap electrode, wherein the sharp shaped corner of the strap electrode is in a state of being spaced from the cathode by the electron transport layer and the electron injection layer;

step S6, applying a voltage between the auxiliary electrode and the cathode to generate an electric field between the strap electrode and the cathode, and thereby the electron transport layer and the electron injection layer corresponding to the area of the sharp shaped corner being punctured under the electric field, and the sharp shaped corner being changed from the state of being spaced from the cathode to be a state of being directly connected with the cathode.

\* \* \* \* \*